(12) United States Patent
Huo

(10) Patent No.: US 12,133,413 B2
(45) Date of Patent: Oct. 29, 2024

(54) DISPLAY PANEL AND DISPLAY DEVICE

(71) Applicant: WUHAN TIANMA MICRO-ELECTRONICS CO., LTD., Wuhan (CN)

(72) Inventor: Sitao Huo, Shanghai (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 18/305,893

(22) Filed: Apr. 24, 2023

(65) Prior Publication Data

US 2023/0263007 A1    Aug. 17, 2023

Related U.S. Application Data

(63) Continuation of application No. 16/903,048, filed on Jun. 16, 2020, now Pat. No. 11,665,924.

(30) Foreign Application Priority Data

Jan. 3, 2020 (CN) .......................... 202010003719.6

(51) Int. Cl.
*H10K 50/844* (2023.01)
*H01L 27/15* (2006.01)
(Continued)

(52) U.S. Cl.
CPC ......... *H10K 50/844* (2023.02); *H01L 27/156* (2013.01); *H10K 50/8445* (2023.02); *H10K 50/856* (2023.02); *H10K 59/38* (2023.02)

(58) Field of Classification Search
CPC ............. H10K 50/844; H10K 50/8445; H10K 50/856; H10K 59/38; H01L 27/156
See application file for complete search history.

(56) References Cited

U.S. PATENT DOCUMENTS 11,665,924 B2 * 5/2023 Huo ..................... H10K 59/878
 257/40
2006/0208293 A1 * 9/2006 Lim .................. G02F 1/133514
 438/70

(Continued)

FOREIGN PATENT DOCUMENTS

CN      106941113 A      7/2017
CN      105304684 B      2/2019

OTHER PUBLICATIONS

State Intellectual Property Office of the People's Republic of China, Second Office Action, Chinese Patent Application No. 202010003719.6, Mailed Aug. 8, 2022, 13 pages.

(Continued)

*Primary Examiner* — Mary Ellen Bowman
(74) *Attorney, Agent, or Firm* — CHRISTENSEN O'CONNOR JOHNSON KINDNESS PLLC

(57) ABSTRACT

A display panel and a display device are provided. The display panel includes a substrate, a plurality of sub-pixels, and a color conversion layer. At least one sub-pixel of the plurality of sub-pixels each includes a light-emitting element. The color conversion layer is configured to convert a color of light emitted by the light-emitting element. The at least one light-emitting element of the at least one sub-pixel includes at least one blue light light-emitting element. The color conversion layer includes a red conversion layer and a green conversion layer, the red conversion layer is configured to convert blue light into red light, and the green conversion layer is configured to convert blue light into green light. The red conversion layer and the green conversion layer have different areas or different thicknesses.

20 Claims, 7 Drawing Sheets

(51) Int. Cl.
 *H10K 50/856* (2023.01)
 *H10K 59/38* (2023.01)

(56) References Cited

U.S. PATENT DOCUMENTS

| | | | | |
|---|---|---|---|---|
| 2012/0119239 A1* | 5/2012 | Kim | ........................ | H10K 59/38 |
| | | | | 257/E33.059 |
| 2014/0312339 A1 | 10/2014 | Fujita | | |
| 2015/0309359 A1* | 10/2015 | Wu | ........................ | G02B 5/201 |
| | | | | 359/891 |
| 2018/0197920 A1 | 7/2018 | Gai et al. | | |
| 2019/0157354 A1* | 5/2019 | Lee | ........................ | H01L 33/501 |

OTHER PUBLICATIONS

State Intellectual Property Office of the People's Republic of China, First Office Action, Chinese Patent Application No. 202010003719.6, Mailed Mar. 3, 2022, 12 pages.

* cited by examiner

DISPLAY PANEL AND DISPLAY DEVICE

CROSS-REFERENCE TO RELATED APPLICATIONS

This application is a continuation of U.S. patent application Ser. No. 16/903,048, filed on Jun. 16, 2020, which claims priority to Chinese Patent Application No. 202010003719.6, filed on Jan. 3, 2020. All of the above-mentioned patent applications are hereby incorporated by reference in their entireties.

TECHNICAL FIELD

The present disclosure relates to the field of display technologies, and in particular, to a display panel and a display device.

BACKGROUND

The colorization can be performed by a variety of ways, among which color conversion is one of the most widely used ones. For example, by combining a light source and a color conversion layer, the color conversion layer can convert light having a color emitted by the light source into white light; or by combining a light source, a color conversion layer and a color filter layer, the color conversion layer can convert light having a color emitted by the light source into white light, and then the color filter layer can convert the white light into colorama.

In the related art, color conversion technology is mainly applied in a backlight module of a liquid crystal display device and rarely applied in an organic light-emitting diode display panel (OLED display panel). Since the OLED display panel includes a relatively large number of layers, if it is applied to the OLED display panel, the display panel will be relatively thick, which easily results in a color cast.

SUMMARY

In an aspect, an embodiment of the present disclosure provides a display panel. The display panel includes a substrate, a plurality of sub-pixels, and a color conversion layer. At least one sub-pixel of the plurality of sub-pixels each includes a light-emitting element. The color conversion layer is configured to convert a color of light emitted by the light-emitting element. The at least one light-emitting element of the at least one sub-pixel includes at least one blue light light-emitting element. The color conversion layer includes a red conversion layer and a green conversion layer, the red conversion layer is configured to convert blue light into red light, and the green conversion layer is configured to convert blue light into green light. The red conversion layer and the green conversion layer have different areas or different thicknesses.

In an aspect, an embodiment of the present disclosure provides a display device. The display panel includes a substrate, a plurality of sub-pixels, and a color conversion layer. At least one sub-pixel of the plurality of sub-pixels each includes a light-emitting element. The color conversion layer is configured to convert a color of light emitted by the light-emitting element. The at least one light-emitting element of the at least one sub-pixel includes at least one blue light light-emitting element. The color conversion layer includes a red conversion layer and a green conversion layer, the red conversion layer is configured to convert blue light into red light, and the green conversion layer is configured to convert blue light into green light. The red conversion layer and the green conversion layer have different areas or different thicknesses.

BRIEF DESCRIPTION OF DRAWINGS

In order to more clearly illustrate technical solutions in embodiments of the present disclosure, the accompanying drawings used in the embodiments are briefly introduced as follows. The drawings described as follows are merely part of the embodiments of the present disclosure. Based on these drawings, other drawings can also be acquired by those skilled in the art.

DESCRIPTION OF EMBODIMENTS

In order to better understand technical solutions of the present disclosure, the embodiments of the present disclosure are described in detail with reference to the drawings.

It should be clear that the described embodiments are merely part of the embodiments of the present disclosure rather than all of the embodiments. Based on these embodiments, other embodiments obtained by those skilled in the art shall fall into the protection scope of the present disclosure.

The terms used in the embodiments of the present disclosure are merely for describing embodiments, but not intended to limit the present disclosure. Unless otherwise noted in the context, the expressions "a", "an", "the" and "said" in a singular form used in the embodiments and appended claims of the present disclosure are also intended to represent plural form expressions thereof.

It should be understood that the term "and/or" used herein is merely an association relationship describing associated objects, indicating that there may be three relationships, for example, A and/or B may indicate that three cases, i.e., A alone, A and B, B alone. In addition, the character "/" herein generally indicates that the related objects before and after the character form an "or" relationship.

The sub-pixel and light-emitting element can be described using the terms of "first", "second", "third", etc., in the embodiments of the present disclosure, the sub-pixel and light-emitting element will not be limited to these terms. These terms are merely used to distinguish sub-pixels from one another and distinguish light-emitting elements from one another. For example, without departing from the scope of the embodiments of the present disclosure, a first sub-pixel can also be referred to as a second sub-pixel, similarly, a second sub-pixel can also be referred to as a first sub-pixel.

Figure 1:
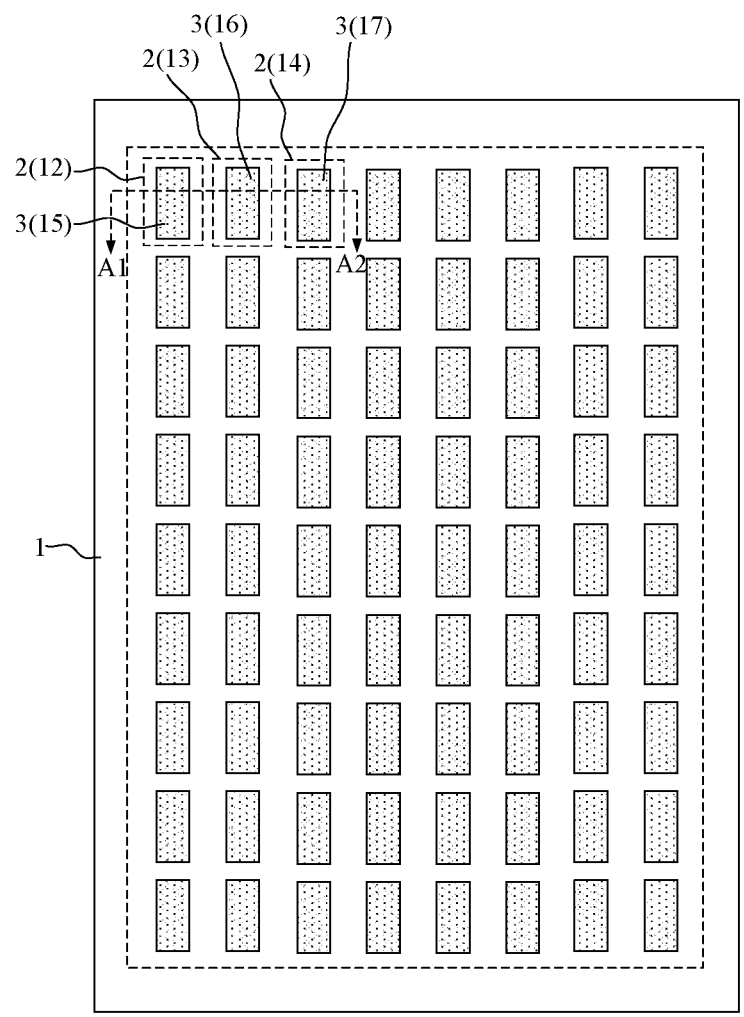
FIG. 1 is a top view of a display panel according to an embodiment of the present disclosure.
Figure 2:
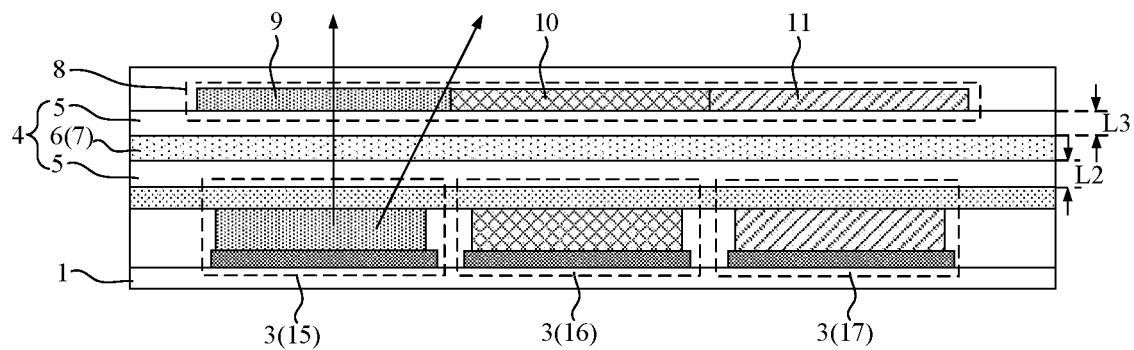
FIG. 2 is a cross-sectional view along A1-A2 of FIG. 1.

An embodiment of the present disclosure provides a display panel. FIG. 1 is a top view of a display panel according to an embodiment of the present disclosure, and FIG. 2 is a cross-sectional view along A1-A2 shown in FIG. 1. As shown in FIG. 1 and FIG. 2, the display panel includes a substrate 1, multiple sub-pixels 2, a thin film encapsulation layer 4, and a color filter layer 8. Each sub-pixel includes a light-emitting element 3. The thin film encapsulation layer 4 is located at a side of the light-emitting element 3 facing away from the substrate 1 and includes multiple inorganic encapsulation layers 5 and multiple organic encapsulation layers 6 that are alternately stacked. At least one organic encapsulation layer 6 is an organic color conversion layer 7 that is configured to convert a color of light emitted by the light-emitting element 3. The color filter layer 8 is located at a side of the thin film encapsulation layer 4 facing away from the substrate 1 and includes multiple color resists that are configured to filter light in a certain wave band such that only light in a specific wave band can be emitted out.

Since an inorganic material has good compactness and water resistance, the thin film encapsulation layer 4 mainly utilizes the inorganic encapsulation layer 5 to isolate water and oxygen, so that external water and oxygen can be prevented from invading the display panel to avoid erosion of the light-emitting elements 3. However, the organic color conversion layer 7 is configured to improve flexibility, so that when a crack is generated in the inorganic encapsulation layer 5 due to external forces and other factors, the organic color conversion layer 7 can prevent the crack from spreading, thereby improving encapsulation reliability of the thin film encapsulation layer 4.

With the display panel provided by the embodiment of the present disclosure, colorful display can be realized by using the color conversion technology. For example, during displaying an image, the light-emitting element 3 emits blue light, and when the blue light is transmitted to the thin film encapsulation layer 4, a color conversion is performed on the blue light by the organic color conversion layer 7 arranged in the thin film encapsulation layer 4, so that light emitted from the thin film encapsulation layer 4 is converted into white light. Then, the white light is continuously transmitted to the color filter layer 8, and the white light is filtered by the color resist arranged in the color filter layer 8, so that light finally emitted via some color resists is red light, light emitted via some color resists is green light, and light emitted via some color resists is blue light. In this way, a colorful image can be displayed.

With the display panel provided by the embodiment of the present disclosure, at least one organic encapsulation layer 6 arranged in the thin film encapsulation layer 4 is reused as the organic color conversion layer 7, so as to arrange the organic color conversion layer 7 in the thin film encapsulation layer 4. In this case, the organic color conversion layer 7 and the organic encapsulation layer 6 that is reused as the organic color conversion layer 7 only occupy one layer space. Since the organic color conversion layer 7 has a function of converting color, there is no need to provide an additional layer for color conversion, thereby reducing an overall thickness of the display panel and thus being more conducive to achieving a thinning and lightening design of the display panel. Moreover, a distance between the color filter layer 8 and the light-emitting element 3 is also reduced accordingly, and thus a transmission distance of oblique light emitted from the light-emitting element 3 to the color filter layer 8 is reduced accordingly, thereby reducing a probability that the oblique light is transmitted to the color resist corresponding to an adjacent light-emitting element 3 (hereinafter referred to as an adjacent color resist). In this way, the color cast is ameliorated.

In addition, the reduction of the overall thickness of the display panel and the reduction of the distance between the color filter layer 8 and the light-emitting element 3 are realized by reusing the organic encapsulation layer 6 as the organic color conversion layer 7, which does not affect structures of other layers arranged in the display panel, makes a manufacturing process relatively simple, and has a relatively high implementability.

In an example, the light-emitting elements 3 in sub-pixels 2 are blue light light-emitting elements, that is, each light-emitting element 3 emits blue light. When the organic color conversion layer 7 converts light emitted by multiple light-emitting elements 3 into light having a same color and the light-emitting elements 3 arranged in sub-pixels 2 are configured as light-emitting elements that emit light having a same color, only one kind of organic color conversion material can be used to form the organic color conversion layer 7. In this case, process complexity is reduced.

In an example, with further reference to FIG. 2, the organic color conversion layer 7 is configured to convert blue light into light having a first color, and the first color is a complementary color to the blue light, such as a yellow color. The color filter layer 8 can include a red color resist 9, a green color resist 10 and a blue color resist 11.

In combination with FIG. 1 and FIG. 2, in an embodiment, the sub-pixels 2 includes a first sub-pixel 12, a second sub-pixel 13, and a third sub-pixel 14, the first sub-pixel 12 includes a first light-emitting element 15, the second sub-pixel 13 includes a second light-emitting element 16, and the third sub-pixel 14 includes a third light-emitting element 17. For the first sub-pixel 12, blue light emitted by the first light-emitting element 15 is transmitted to the organic color conversion layer 7, then a color conversion material of the organic color conversion layer 7 is excited by the blue light and then emits light having the first color, and then the light having the first color is mixed with a background blue light to form white light. When the white light is transmitted to the red color resist 9 corresponding to the first sub-pixel 12, the red color resist 9 allows light in a red wave band of the white light to be emitted out, while filtering out light in other wave band, so that light finally emitted via the red color resist 9 is red light. For the second sub-pixel 13, blue light emitted by the second light-emitting element 16 is transmitted to the organic color conversion layer 7, then the color conversion material of the organic color conversion layer 7 is excited by the blue light and then emits light having the first color, and then the light having the first color is mixed with the background blue light to form white light. When the white light is transmitted to the green color resist 10 corresponding to the second sub-pixel 13, the green color resist 10 allows light in a green wave band of the white light to be emitted out, while filtering out light in other wave band, so that light finally emitted via the green color resist 10 is green light. For the third sub-pixel 14, blue light emitted by the third light-emitting element 17 is transmitted to the organic color conversion layer 7, then the color conversion material of the organic color conversion layer 7 is excited by the blue light and then emits light having the first color, and then the light having the first color is mixed with the background blue light to form white light. When the white light is transmitted to the blue color resist 11 corresponding to the third sub-pixel 14, the blue color resist 11 allows light in a green wave band of the white light to be emitted out, while filtering out light in other wave band, so that light finally emitted via the blue color resist 11 is blue light.

With the above configuration, the light emitted via the organic color conversion layer 7 undergoes a conversion from the blue light into white light, and then the color resists of different colors arranged in the color filter layer 8 convert white light into the red light, the green light, and the blue light, thereby achieving a colorful display of the display panel.

Figure 3:
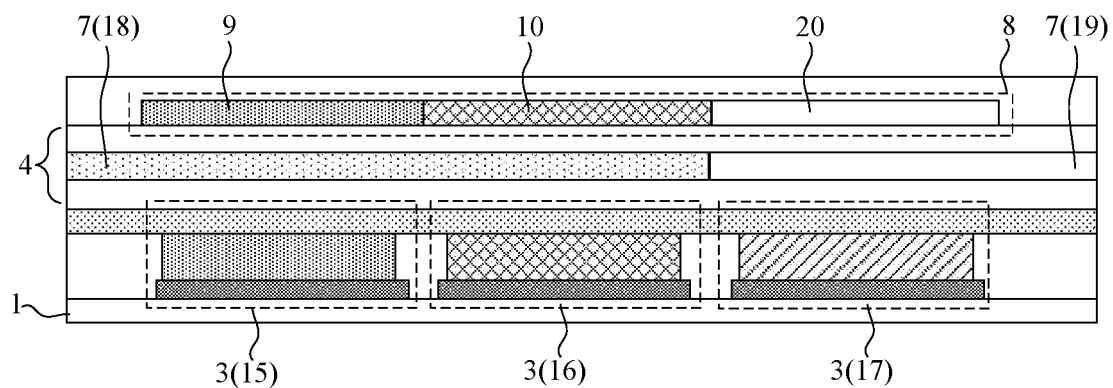
FIG. 3 is another cross-sectional view along A1-A2 shown in FIG. 1.

FIG. 3 is another cross-sectional view along A1-A2 shown in FIG. 1. In an embodiment, as shown in FIG. 3, the organic color conversion layer 7 includes a complementary color conversion layer 18 and a first organic layer 19. The complementary color conversion layer 18 is configured to convert blue light into light having the first color, and the first color is a complementary color to the blue light, such as a yellow color. The color filter layer 8 includes a red color resist 9, a green color resist 10, and a white color resist 20. In a direction perpendicular to a plane of the substrate 1, the red color resist 9 and the green color resist 10 each overlap the complementary color conversion layer 18, and the white color resist 20 overlaps the first organic layer 19.

The first organic layer 19 is made of an organic material, and the first organic layer 19 is only used to improve flexibility and does not have a function of converting color. The white color resist 20 does not filter light, and thus light can still retain its original color when the light is emitted via the white color resist 20.

In an embodiment, combining FIG. 1 and FIG. 3, the sub-pixels 2 includes a first sub-pixel 12, a second sub-pixel 13, and a third sub-pixel 14, the first sub-pixel 12 includes a first light-emitting element 15, the second sub-pixel 13 includes a second light-emitting element 16, and the third sub-pixel 14 includes a third light-emitting element 17. For the first sub-pixel 12, blue light emitted by the first light-emitting element 15 is transmitted to the complementary color conversion layer 18, then a color conversion material of the complementary color conversion layer 18 is excited by the blue light and then emits light having the first color, and then the light having the first color is mixed with the background blue light to form white light. When the white light is transmitted to the red color resist 9 corresponding to the first sub-pixel 12, the red color resist 9 allows light in the red wave band of the white light to be emitted out, so that light finally emitted via the red color resist 9 is red light. For the second sub-pixel 13, blue light emitted by the second light-emitting element 16 is transmitted to the complementary color conversion layer 18, then the color conversion material of the complementary color conversion layer 18 is excited by the blue light and then emits light having the first color, and then the light having the first color is mixed with the background blue light to form white light. When the white light is transmitted to the green color resist 10 corresponding to the second sub-pixel 13, the green color resist 10 allows light in the green wave band of the white light to be emitted out, so that the light finally emitted via the green color resist 10 is green light. For the third sub-pixel 14, blue light emitted by the third light-emitting element 17 is transmitted to the first organic layer 19 and then is emitted out via the white color resist, and the blue light does not undergo a color conversion, so that light finally emitted via the white color resist 20 is still a blue light.

With the above configuration, the light emitted by the first light-emitting element 15 undergoes a conversion from blue light into white light by using the complementary color conversion layer 18, and then the light undergoes a conversion from a white light into a red light by using the red color resist 9; the light emitted by the second light-emitting element 16 undergoes a conversion from blue light into white light by using the complementary color conversion layer 18, and then the light undergoes a conversion from a white light into a red light by using the green color resist 10; and the light emitted by the third light-emitting element 17 does not undergo a color conversation when the light is emitted via the first organic layer 19 and the white color resist 20, so that the light finally emitted out is still blue light. Since the blue light emitted by the third light-emitting element 17 does not undergo a color conversion, a deviation in color purity caused by incomplete conversion can be avoided, thereby improving color purity of the blue light finally emitted out.

In an embodiment, if blue light does not undergo a color conversion, the organic color conversion layer 7 can be only provided with the complementary color conversion layer 18 and is not provided with the first organic layer 19, and the color filter layer 8 can be provided with only the red color resist 9 and the green color resist 10 and is not provided with the white color resist 20. However, with the configuration shown in FIG. 3, the organic color conversion layer 7 is provides with the first organic layer 19 and the color filter layer 8 is provides with the white color resist 20, so that the first organic layer 19 can be used to improve flatness of a layer where the organic color conversion layer 7 is located and the white color resist 20 can be used to improve flatness of a layer where the color filter layer 8 is located. Moreover, providing the first organic layer 19 in the organic color conversion layer 7 can also improve flexibility of the organic color conversion layer 7. When a crack is generated in the inorganic encapsulation layer 5, the first organic layer 19 can prevent the crack in the inorganic encapsulation layer 5 from spreading, thereby improving the encapsulation reliability of the thin film encapsulation layer 4.

Figure 4:
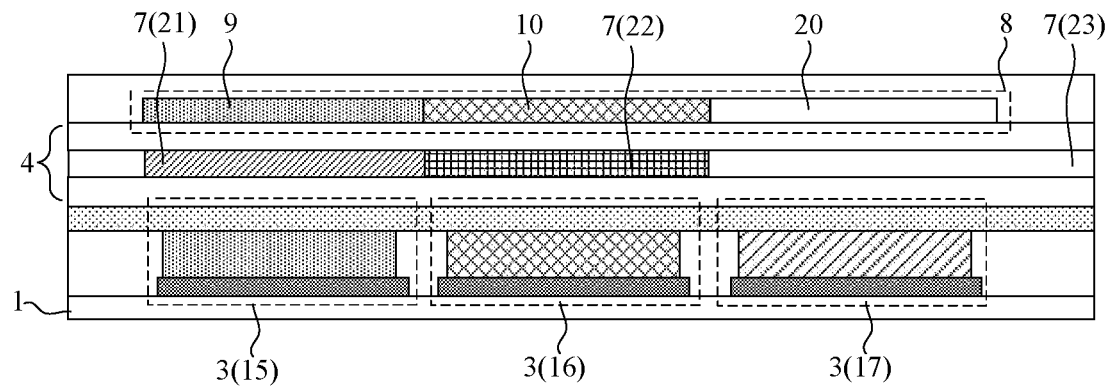
FIG. 4 is another cross-sectional view along A1-A2 shown in FIG. 1.

FIG. 4 is still another cross-sectional view along A1-A2 shown in FIG. 1. In an embodiment, as shown in FIG. 4, the color conversion layer includes a red conversion layer 21, a green conversion layer 22, and a second organic layer 23. The red conversion layer 21 is configured to convert blue light into red light, and the green conversion layer 22 is configured to convert blue light into green light. The second organic layer 23, which is made of an organic material, is only configured to improve flexibility and incapable of converting color. The color filter layer 8 includes a red color resist 9, a green color resist 10, and a white color resist 20. In the direction perpendicular to the plane of the substrate, the red color resist 9 overlaps the red conversion layer 21, the green color resist 10 overlaps the green conversion layer 22, and the white color resist 20 overlaps the second organic layer 23.

With reference to FIG. 1 and FIG. 4, in an example, the sub-pixels 2 include a first sub-pixel 12, a second sub-pixel 13, and a third sub-pixel 14, the first sub-pixel 12 includes a first light-emitting element 15, the second sub-pixel 13 includes a second light-emitting element 16, and the third sub-pixel 14 includes a third light-emitting element 17. For the first sub-pixel 12, blue light emitted by the first light-emitting element 15 is transmitted to the red conversion layer 21, is converted into red light by the red conversion layer 21, then is emitted via the red color resist 9. For the second sub-pixel 13, blue light emitted by the second light-emitting element 16 is transmitted to the green conversion layer 22, is converted into green light by the green conversion layer 22, then is emitted via the green color resist 10. For the third sub-pixel 14, blue light emitted by the third light-emitting element 17 is transmitted to the second organic layer 23 and emitted via the white color resist 20. Since the blue light does not undergo a color conversion, the light emitted via the white color resist 20 is still blue light.

With the illustrated configuration, the red conversion layer 21 and the green conversion layer 22 can directly convert the blue light emitted by the first light-emitting element 15 into red light and green light, respectively, and it is no longer necessary to convert it into white light, thereby improving the color purity of red light and green light finally emitted out. For the third sub-pixel 14, the blue light emitted by the third light-emitting element 17 does not undergo a color conversion when being emitted via the second organic layer 23 and the white color resist 20, so that a deviation in color purity caused by incomplete conversion can be avoided, thereby improving color purity of the blue light finally emitted out.

In an embodiment, if blue light does not undergo the color conversion, the organic color conversion layer 7 can be provided with only the red conversion layer 21 and the green conversion layer 22 and is not provided with the second organic layer 23, and the color filter layer 8 can be provided with only the red color resist 9 and the green color resist 10 and is not provided with the white color resist 20. However, with the configuration shown in FIG. 4, by providing the second organic layer 23 in the organic color conversion layer 7 and providing the white color resist 20 in the color filter layer 8, the second organic layer 23 can be used to improve flatness of the layer where the organic color conversion layer 7 is located, and the white color resist 20 can be used to improve flatness of the layer where the color filter layer 8 is located. Moreover, providing the second organic layer 23 in the organic color conversion layer 7 can also improve flexibility of the organic color conversion layer 7. When the cracks are generated in the inorganic encapsulation layer 5, the second organic layer 23 can prevent the cracks in the inorganic encapsulation layer 5 from spreading, thereby improving the encapsulation reliability of the thin film encapsulation layer 4.

Figure 5:
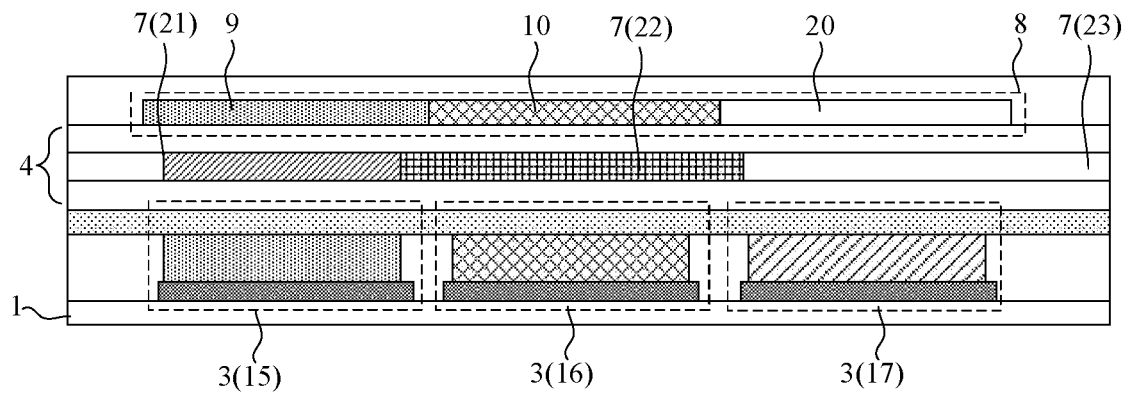
FIG. 5 is a schematic diagram of a red conversion layer and a green conversion layer according to an embodiment of the present disclosure.

FIG. 5 is a schematic diagram of a red conversion layer and a green conversion layer according to an embodiment of the present disclosure. In an embodiment, as shown in FIG. 5, the red conversion layer 21 and the green conversion layer 22 have different color conversion efficiencies and different areas. In an embodiment, the red conversion layer 21 has a color conversion efficiency greater than the color conversion efficiency of the green conversion layer 22 while the red conversion layer 21 has an area is smaller than the area of the green conversion layer 22. In an embodiment, the red conversion layer 21 has a color conversion efficiency smaller than the color conversion efficiency of the green conversion layer 22 while the red conversion layer 21 has an area larger than the area of the green conversion layer 22. According to the color conversion efficiencies of the red conversion layer 21 and the green conversion layer 22, areas thereof can be adjusted such that a color conversion layer having a smaller color conversion efficiency has a larger area. In this way, the enlarged layer can increase a degree of conversion of blue light, so that the red conversion layer 21 and the green conversion layer 22 tend to have a same degree of conversion of blue light, thereby improving uniformity of the degree of conversion of blue light by the red conversion layer 21 and the degree of conversion of blue light by the green conversion layer 22.

Figure 6:
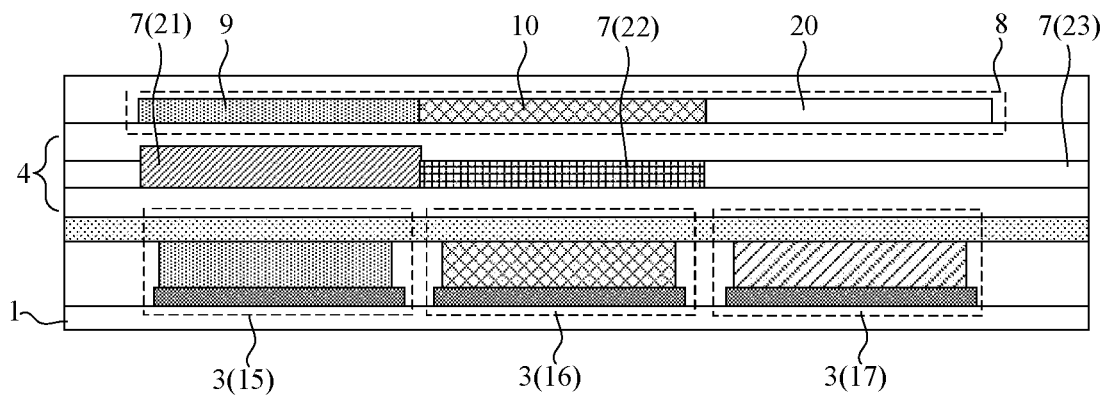
FIG. 6 is another schematic diagram of a red conversion layer and a green conversion layer according to an embodiment of the present disclosure.

FIG. 6 is another schematic diagram of a red conversion layer and a green conversion layer according to an embodiment of the present disclosure. In an embodiment, as shown in FIG. 6, the red conversion layer 21 and the green conversion layer 22 have different color conversion efficiencies, and the red conversion layer 21 and the green conversion layer 22 have different thicknesses in the direction perpendicular to the plane of the substrate 1. In an embodiment, the red conversion layer 21 has a color conversion efficiency greater than the color conversion efficiency of the green conversion layer 22, while the red conversion layer 21 has a thickness smaller than the thickness of the green conversion layer 22. In an embodiment, the red conversion layer 21 has a color conversion efficiency smaller than the color conversion efficiency of the green conversion layer 22, while the red conversion layer 21 has a thickness greater than the thickness of the green conversion layer 22. According to the color conversion efficiencies of the red conversion layer 21 and the green conversion layer 22, the thicknesses thereof can be adjusted such that the color conversion layer having a smaller color conversion efficiency has a larger thickness. In this way, the thickened layer can increase a degree of conversion of blue light, so that the red conversion layer 21 and the green conversion layer 22 tend to have a same degree of conversion of blue light, thereby improving uniformity of the conversion of blue light by the red conversion layer 21 and the conversion of blue light by the green conversion layer 22.

Figure 7:
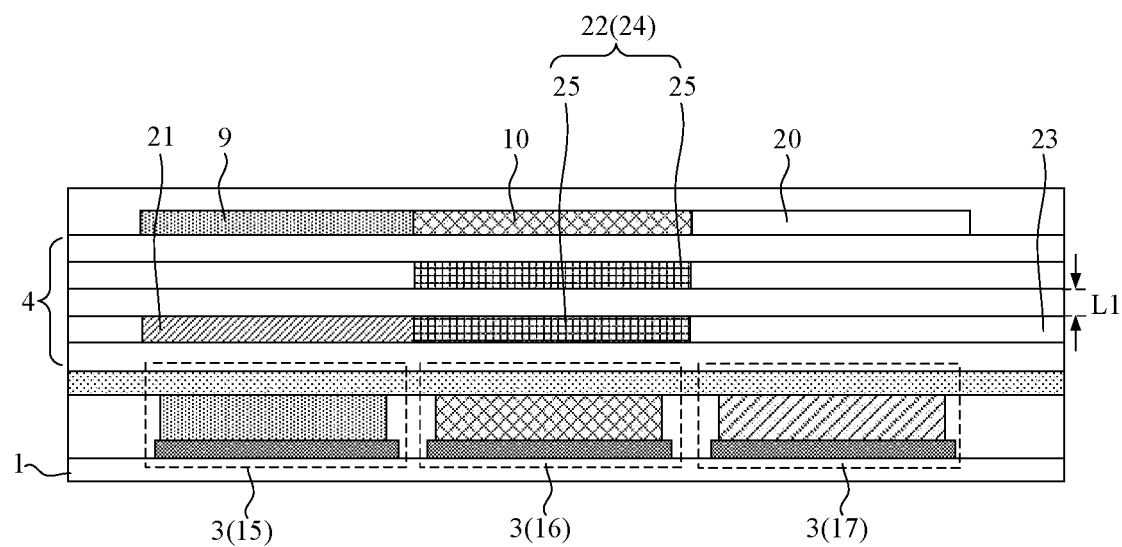
FIG. 7 is still another schematic diagram of a red conversion layer and a green conversion layer according to an embodiment of the present disclosure.

FIG. 7 is another schematic diagram of a red conversion layer and a green conversion layer according to an embodiment of the present disclosure. In an embodiment, as shown in FIG. 7, a first color conversion layer 24 includes at least two color conversion sub-layers 25 arranged in different layers. If the color conversion efficiency of the red conversion layer 21 is greater than the color conversion efficiency of the green conversion layer 22, as shown in FIG. 7, the first color conversion layer 24 is the green conversion layer 22. If the color conversion efficiency of the red conversion layer 21 is smaller than the color conversion efficiency of the green conversion layer 22, the first color conversion layer 24 is the red conversion layer 21.

In an example in which the color conversion efficiency of the red conversion layer 21 is larger than the color conversion efficiency of the green conversion layer 22, since the color conversion efficiency of the green conversion layer 22 is smaller than that of the red conversion layer 21, if the green conversion layer 22 is set as a single layer, it cannot be ensured that all blue light can be performed with the color conversion, thereby resulting in a color cast of light finally emitted out. In above embodiment of the present disclosure, by setting at least two green color conversion sub-layers 25, the color conversion sub-layers 25 can be used to perform multiple color conversions of blue light. In this way, color conversion of all blue light can be completed, thereby avoiding the color cast caused by incomplete color conversion of blue light.

With further reference to FIG. 7, in order to make a distance between the color conversion sub-layers 25 be relatively small to improve a conversion efficiency of blue light to a greater extent, a distance between two closest color conversion sub-layers 25 is L1, where L1≤5 μm.

With further reference to FIG. 2, the distance between the organic color conversion layer 7 and the light-emitting element 3 is L2, and the distance between the organic color conversion layer 7 and the color filter layer 8 is L3, where L2≤5 µm and L3≤5 µm. By setting a minimum value of the distance L2 between the organic color conversion layer 7 and the light-emitting element 3 to be 5 µm and setting a minimum value of the distance L3 between the organic color conversion layer 7 and the color filter layer 8 to be 5 µm, a distance between the color filter layer 8 and the light-emitting element 3 is small, thereby reducing a transmission distance of oblique light emitted from the light-emitting element 3 to the color filter layer 8 and thus reducing a probability that the oblique light is transmitted to the adjacent color resist.

In an embodiment, the organic color conversion layer 7 is formed by coating with an organic phosphor material. Since the organic phosphor material itself can simultaneously achieve encapsulation and color conversion, directly coating an entire surface with the organic phosphor material to form the organic color conversion layer 7 can ensure that the organic phosphor material uniformly distributes, thereby improving an uniformity of a degree of color conversion of light in each area of the organic color conversion layer 7.

Figure 8:
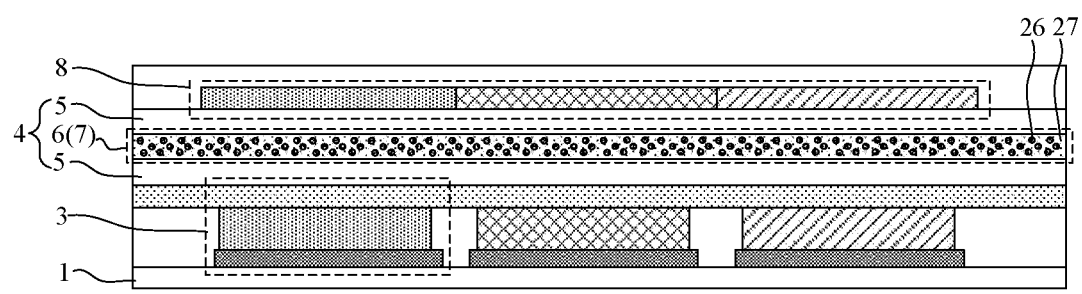
FIG. 8 is a schematic diagram of an organic color conversion layer according to an embodiment of the present disclosure.

FIG. 8 is a schematic diagram of an organic color conversion layer according to an embodiment of the present disclosure. In an embodiment, as shown in FIG. 8, the organic color conversion layer 7 is formed by coating with an organic material 27 doped with color conversion particles 26. The organic color conversion layer 7 is formed by doping the color conversion particles 26 into the organic material 27, which ensures the organic material 27 can be selected within a wide range under a premise that the organic color conversion layer 7 has a function of converting color. For example, organic material 27, such as acrylic or epoxy resin that have a strong adhesion to inorganic material can be used for coating, thereby improving the encapsulation reliability of thin film encapsulation layer 4. In a process of manufacturing the organic color conversion layer 7, after a certain proportion of color conversion particles 26 are added into the organic material 27, sufficiently stirring can be performed, thereby improving uniformity of distribution of the color conversion particles 26 in the organic color conversion layer 7, and thus improving uniformity of a degree of color conversion of light in each area of the organic color conversion layer 7.

Figure 9:
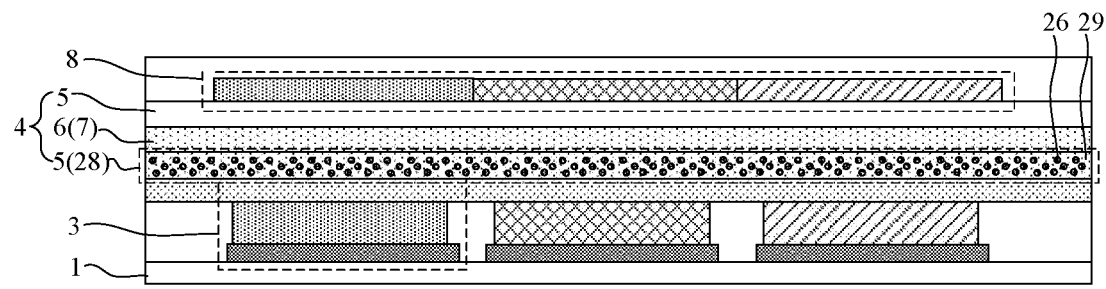
FIG. 9 is another schematic diagram of a display panel according to an embodiment of the present disclosure.

FIG. 9 is another schematic diagram of a display panel according to an embodiment of the present disclosure. In an embodiment, as shown in FIG. 9, at least one inorganic encapsulation layer 5 is an inorganic color conversion layer 28. The inorganic color conversion layer 28 is configured to convert color of light emitted by the light-emitting element 3. At least one inorganic encapsulation layer 5 is also reused as the inorganic color conversion layer 28, so that the thin film encapsulation layer 4 includes at least two color conversion layers (one organic color conversion layer 7 and one inorganic color conversion layer 28) that perform color conversion on light emitted by the light-emitting element 3, thereby improving a conversion efficiency of light.

In an embodiment, with further reference to FIG. 9, the inorganic color conversion layer 28 is formed by coating with an inorganic material 29 doped with color conversion particles 26. The organic color conversion layer 28 is formed by doping the color conversion particles 26 into the inorganic material 29, so that the organic color conversion layer 28 have both the encapsulation function and the color conversion function due to the water and oxygen blocking performance of the inorganic material 29 and the color conversion of the color conversion particles 26. Moreover, with the configuration, the inorganic material 29 can be selected within a relatively wide range. In an embodiment, the inorganic material 29 having a high adhesion to the organic materials can be selected, so as to improve the encapsulation of the thin film encapsulation layer 4.

In an embodiment, the organic color conversion layer 28 can be formed by coating with an inorganic color conversion material, thereby achieving uniform coating of the inorganic color conversion material and improving uniformity of a degree of color conversion of light in each area of the inorganic color conversion layer 28.

In an embodiment, of the present disclosure, the light-emitting element 3 can be an organic light-emitting diode, a light-emitting diode, or a light source emitting light in ultraviolet wave band. When the light-emitting element 3 is any one of the light sources described above, the light emitted by the light-emitting element 3 can be converted into colorama via the organic color conversion layer 7 and the color filter layer 8, thereby achieving a colorful display of the display panel.

Figure 10:
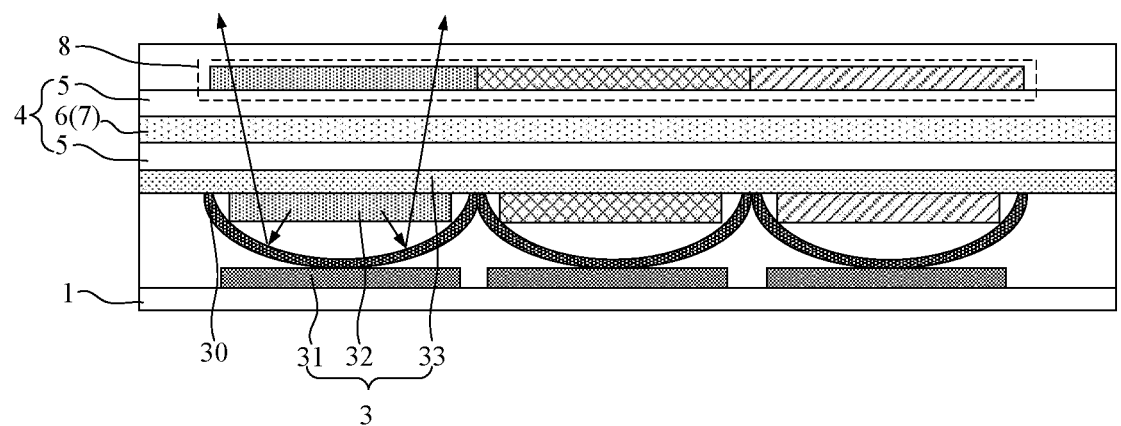
FIG. 10 is a schematic diagram of a concave reflective layer according to an embodiment of the present disclosure.

FIG. 10 is a schematic diagram of a concave reflective layer according to an embodiment of the present disclosure. In an embodiment, as shown in FIG. 10, the display panel further includes a concave reflective layer 30, and the concave reflective layer 30 is configured to reflect the oblique light emitted by the light-emitting element 3. Since the light emitted by the light-emitting element 3 is divergent, the light emitted by the light-emitting element 3 that is transmitted in a non-front visual angle direction is reflected by the concave reflective layer 30. As a result, the reflected light is emitted toward a front visual angle direction, thereby increasing a light emission rate at the front visual angle and improving a luminous efficiency.

In an embodiment, with further reference to FIG. 10, the light-emitting element 3 is the organic light-emitting diode, the light-emitting element 3 includes an anode 31, a light-emitting layer 32, and a cathode 33, the concave reflective layer 30 is located between the anode 31 and the cathode 33, and the light-emitting layer 32 is located in the reflective layer 30. In this case, the light emitted from the light-emitting layer 32 in the non-front visual angle direction is reflected by the concave reflective layer 30, so that the light is emitted toward the front visual angle, thereby increasing the light emission rate at the front visual angle. In an embodiment, in order to ensure that the light-emitting layer 32 emits light under a driving voltage received by the anode 31, the concave reflective layer 30 can have an electrical conductivity, and a hole injection layer and a hole transport layer can be provided between the light-emitting layer 32 and the concave reflective layer 30.

Figure 11:
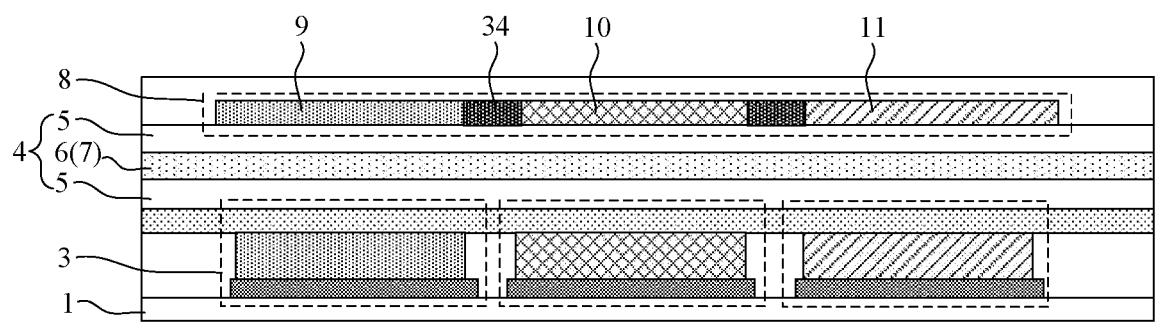
FIG. 11 is a schematic diagram of a light shielding layer according to an embodiment of the present disclosure.

FIG. 11 is a schematic diagram of a light shielding layer according to an embodiment of the present disclosure. In an embodiment, as shown in FIG. 11, a light shielding layer 34 can be provided between two adjacent color resists of color filter layer 8 (such as between the red color resist 9 and the green color resist 10, between the green color resist 10 and the blue color resist 11, or between the blue color resist 11 and the red color resist 9). The light shielding layer 34 shields the oblique light emitted by the light-emitting element 3, thereby preventing the light emitted by the light-emitting element 3 from being emitted via the adjacent color resist, and thus ameliorating the color cast to a greater extent.

Figure 12:
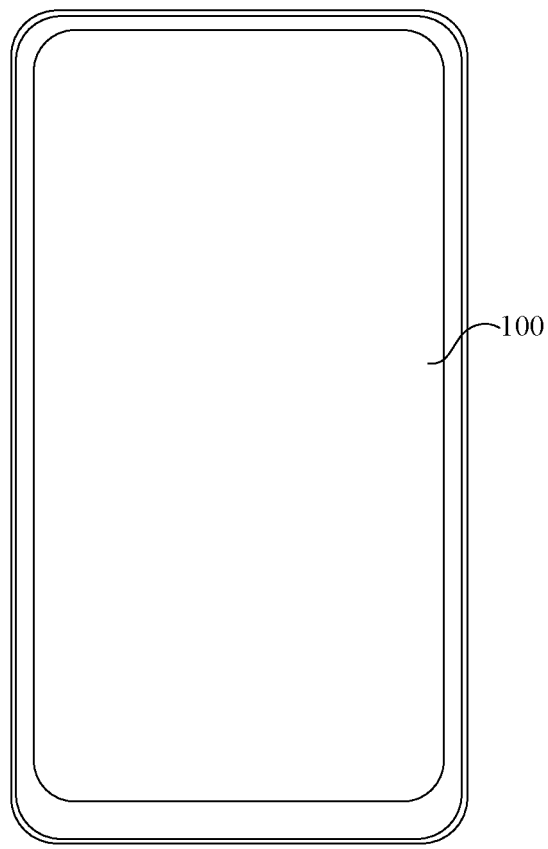
FIG. 12 is a schematic diagram of a display device according to an embodiment of the present disclosure.

An embodiment of the present disclosure further provides a display device. FIG. 12 is a schematic diagram of a display device according to an embodiment of the present disclosure. As shown in FIG. 12, the display device includes the display panel 100 described above. A structure of the display panel 100 has been described in detail in the above embodiments and is not repeated herein. The display device shown in FIG. 12 is merely illustrated as an example, and the display device can be any electronic device having a display function, such as a mobile phone, a tablet computer, a notebook computer, an electronic paper book, or a television.

The display device provided by the embodiments of the present disclosure includes the display panel 100 described above. Therefore, with the display device, by reusing at least one organic encapsulation layer 6 in the thin film encapsulation layer 4 as the organic color conversion layer 7, the organic color conversion layer 7 can be arranged in the thin film encapsulation layer 4. In this case, the organic color conversion layer 7 and the organic encapsulation layer 6 that is reused as the organic color conversion layer 7 only occupy one layer space, thereby reducing the overall thickness of the display device, which is more conducive to achieving thinning and lightening design of the display device. Moreover, a distance between the color filter layer 8 and the light-emitting element 3 is also reduced accordingly, and thus the transmission distance of oblique light emitted from the light-emitting element 3 to the color filter layer 8 is reduced accordingly, thereby reducing a probability that the oblique light is transmitted to the color resist corresponding to an adjacent light-emitting element 3. In this way, the color cast is ameliorated.

The above-described embodiments are merely exemplary embodiments of the present disclosure and are not intended to limit the present disclosure. Any modifications, equivalent substitutions and improvements made within the principle of the present disclosure shall fall into the protection scope of the present disclosure.

Finally, it should be noted that, the above-described embodiments are merely for illustrating the present disclosure but not intended to provide any limitation. Although the present disclosure has been described in detail with reference to the above-described embodiments, it should be understood by those skilled in the art that it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:

1. A display panel, comprising:
a substrate;
a first blue light-emitting element on the substrate;
a second blue light-emitting element on the substrate;
a third blue light-emitting element on the substrate;
a red conversion layer over the first blue light-emitting element and configured to convert blue light emitted by the first blue light-emitting element into red light;
a green conversion layer over the second blue light-emitting element and configured to convert blue light emitted by the second blue light-emitting element into green light; and
an organic layer over the third blue light-emitting element and allowing blue light emitted by the third blue light-emitting element to pass through,
wherein a color conversion efficiency of the red conversion layer is greater than a color conversion efficiency of the green conversion layer, and a thickness of the red conversion layer is less than a thickness of the green conversion layer, or wherein the color conversion efficiency of the red conversion layer is less than the color conversion efficiency of the green conversion layer, and the thickness of the red conversion layer is greater than the thickness of the green conversion layer.

2. The display panel according to claim 1, wherein the red conversion layer or the green conversion layer comprises at least two color conversion sub-layers arranged in different layers.

3. The display panel according to claim 2, wherein a distance L1 between two closest color conversion sub-layers of the at least two color conversion sub-layers satisfies $L1 \leq 5$ μm.

4. The display panel according to claim 1, wherein
when the color conversion efficiency of the red conversion layer is greater than the color conversion efficiency of the green conversion layer, the green conversion layer comprises at least two green conversion sub-layers arranged in different layers, or
wherein when the color conversion efficiency of the green conversion layer is greater than the color conversion efficiency of the red conversion layer, the red conversion layer comprises at least two red conversion sub-layers arranged in different layers.

5. The display panel according to claim 1, wherein a distance L2 between the red color conversion layer and the first blue light-emitting element satisfies: $L2 \leq 5$ μm.

6. The display panel according to claim 1, further comprising: a color filter layer, wherein a distance L3 between the red color conversion layer and the color filter layer satisfies: $L3 \leq 5$ μm.

7. The display panel according to claim 1, wherein the red conversion layer is made of organic material or inorganic material, and the green conversion layer is made of organic material or inorganic material.

8. The display panel according to claim 1, wherein at least one of the red conversion layer or the green conversion layer is formed by coating with an organic phosphor material organic material or is formed by coating with an organic material doped with color conversion particles.

9. The display panel according to claim 1, wherein at least one of the red conversion layer or the green conversion layer is formed by coating with an inorganic material doped with color conversion particles.

10. The display panel according to claim 1, further comprising: a concave reflective layer configured to reflect oblique light emitted by the first, second, and third blue light-emitting elements.

11. A display device, comprising a display panel, wherein the display panel comprises:
a substrate;
a first blue light-emitting element on the substrate;
a second blue light-emitting element on the substrate;
a third blue light-emitting element on the substrate;
a red conversion layer over the first blue light-emitting element and configured to convert blue light emitted by the first blue light-emitting element into red light;
a green conversion layer over the second blue light-emitting element and configured to convert blue light emitted by the second blue light-emitting element into green light; and
an organic layer over the third blue light-emitting element and allowing blue light emitted by the third blue light-emitting element to pass through,
wherein a color conversion efficiency of the red conversion layer is greater than a color conversion efficiency of the green conversion layer, and a thickness of the red conversion layer is less than a thickness of the green conversion layer, or wherein the color conversion efficiency of the red conversion layer is less than the color conversion efficiency of the green conversion layer, and the thickness of the red conversion layer is greater than the thickness of the green conversion layer.

12. The display device according to claim 11, wherein when the color conversion efficiency of the red conversion layer is greater than the color conversion efficiency of the green conversion layer, the green conversion layer comprises at least two green conversion sub-layers arranged in different layers, or wherein when the color conversion efficiency of the green conversion layer is greater than the color conversion efficiency of the red conversion layer, the red conversion layer comprises at least two red conversion sub-layers arranged in different layers.

13. The display device according to claim 11, further comprising: a concave reflective layer configured to reflect oblique light emitted by the first, second, and third blue light-emitting elements.

14. The display panel according to claim 1, wherein both the red conversion layer and the green conversion layer are made of inorganic material, and the organic layer overlaps the first, second, and third blue light-emitting elements in a plan view, wherein when the color conversion efficiency of the red conversion layer is greater than the color conversion efficiency of the green conversion layer, the green conversion layer comprises a first green conversion sub-layer and a second green conversion sub-layer spaced apart by the organic layer, or when the color conversion efficiency of the green conversion layer is greater than the color conversion efficiency of the red conversion layer, the red conversion layer comprises a first red conversion sub-layer and a second red conversion sub-layer spaced apart by the organic layer.

15. The display panel according to claim 14, wherein when the color conversion efficiency of the red conversion layer is greater than the color conversion efficiency of the green conversion layer, the first green conversion sub-layer is closer to the second blue light-emitting element than the second green conversion sub-layer and formed in a same layer as the red conversion layer, or when the color conversion efficiency of the green conversion layer is greater than the color conversion efficiency of the red conversion layer, the first red conversion sub-layer is closer to the second blue light-emitting element than the second red conversion sub-layer and formed in a same layer as the green conversion layer.

16. A display panel, comprising:
a substrate;
a first blue light-emitting element on the substrate;
a second blue light-emitting element on the substrate;
a third blue light-emitting element on the substrate; and
an organic layer,
wherein the organic layer comprises:
a first portion over the first blue light-emitting element and configured to convert blue light emitted by the first blue light-emitting element into red light;
a second portion over the second blue light-emitting element and configured to convert blue light emitted by the second blue light-emitting element into green light; and
a third portion over the third blue light-emitting element and allowing blue light emitted by the third blue light-emitting element to pass through,
wherein a color conversion efficiency of the red conversion layer is greater than a color conversion efficiency of the green conversion layer, and an area of the red conversion layer is less than an area of the green conversion layer, or wherein the color conversion efficiency of the red conversion layer is less than the color conversion efficiency of the green conversion layer, and the area of the red conversion layer is greater than the area of the green conversion layer.

17. The display panel according to claim 16, further comprising a first inorganic layer and a second inorganic layer, wherein the organic layer is positioned between the first inorganic layer and the second inorganic layer.

18. The display panel according to claim 17, further comprising a color filter layer, wherein the color filter layer comprises a red color resist over the first portion of the organic layer, a green color resist over the second portion of the organic layer, and a white or blue color resist over the third portion of the organic layer.

19. The display panel according to claim 17, wherein the first, second, and third blue light-emitting elements share a common cathode, the first blue light-emitting element further comprises an anode and a light-emitting layer, the second blue light-emitting element further comprises an anode and a light-emitting layer, and the third blue light-emitting element further comprises an anode and a light-emitting layer.

20. The display panel according to claim 16, wherein each of the first portion and the second portion of the organic layer is an acrylic or epoxy resin layer doped with color conversion particles.

\* \* \* \* \*